(12) United States Patent
Wenngren

(10) Patent No.: US 8,117,745 B2
(45) Date of Patent: Feb. 21, 2012

(54) METHOD OF USING A FOLDABLE CARD AS A USB CONTACT

(76) Inventor: Johan Wenngren, Lulea (SE)

( * ) Notice: Subject to any disclaimer, the term of this patent is extended or adjusted under 35 U.S.C. 154(b) by 546 days.

(21) Appl. No.: 12/376,651

(22) PCT Filed: Sep. 13, 2007

(86) PCT No.: PCT/US2007/078332
§ 371 (c)(1),
(2), (4) Date: Feb. 6, 2009

(87) PCT Pub. No.: WO2008/036537
PCT Pub. Date: Mar. 27, 2008

(65) Prior Publication Data
US 2010/0175255 A1 Jul. 15, 2010

Related U.S. Application Data

(60) Provisional application No. 60/826,548, filed on Sep. 22, 2006.

(51) Int. Cl.
*H01R 43/00* (2006.01)
*H01R 9/00* (2006.01)
*H01R 12/00* (2006.01)
*H05K 13/00* (2006.01)
*H05K 3/00* (2006.01)
*H05K 3/02* (2006.01)
*H05K 3/10* (2006.01)
*H05K 1/14* (2006.01)
*H05K 1/00* (2006.01)

(52) U.S. Cl. ............. 29/854; 29/846; 29/842; 361/737; 439/66

(58) Field of Classification Search ............ 29/829–832, 29/834–835, 837, 842, 846, 853–854; 361/736–737, 361/752–753; 439/65–66, 660–663; 174/254–255
See application file for complete search history.

(56) References Cited

U.S. PATENT DOCUMENTS

| | | | |
|---|---|---|---|
| 6,121,676 A * | 9/2000 | Solberg | 257/686 |
| 6,172,418 B1 * | 1/2001 | Iwase | 257/723 |
| 6,208,521 B1 * | 3/2001 | Nakatsuka | 361/749 |
| 6,456,500 B1 * | 9/2002 | Chen | 361/752 |
| 6,743,030 B2 * | 6/2004 | Lin et al. | 439/131 |
| 6,854,984 B1 * | 2/2005 | Lee et al. | 439/79 |
| 6,879,047 B1 * | 4/2005 | Heo | 257/777 |
| 6,884,653 B2 * | 4/2005 | Larson | 438/107 |
| 6,908,792 B2 * | 6/2005 | Bruce et al. | 438/110 |
| 7,124,238 B2 * | 10/2006 | Hong | 711/103 |
| 7,149,095 B2 * | 12/2006 | Warner et al. | 361/803 |
| 7,255,582 B1 * | 8/2007 | Liao | 439/165 |

(Continued)

*Primary Examiner* — David Angwin
(74) *Attorney, Agent, or Firm* — Fasth Law Offices; Rolf Fasth

(57) ABSTRACT

The method is for using a foldable card as a USB contact. A foldable flat card has a folding line and a foldable front flap section and foldable rear flap section. The card has contact segments. The front flap section is upwardly folded until the front flap section bears against a top surface of the card. The rear flap section is also upwardly folded until the rear flap section bears against the top surface of the card. A front segment is downwardly folded along the folding line until an underside of a rear segment bears against an underside of the front segment and the contact segment comes into contact with the contact segment to form a USB contact. The USB contact is then inserted into a computer.

9 Claims, 3 Drawing Sheets

U.S. PATENT DOCUMENTS

| | | | |
|---|---|---|---|
| 7,391,006 B2 * | 6/2008 | Cheng et al. | 250/221 |
| 7,516,269 B2 * | 4/2009 | Hong | 711/103 |
| 7,623,354 B2 * | 11/2009 | Koh | 361/764 |
| D628,151 S * | 11/2010 | Wegener et al. | D13/108 |
| 2003/0168725 A1 * | 9/2003 | Warner et al. | 257/686 |
| 2005/0097929 A1 * | 5/2005 | Anderson | 70/16 |
| 2005/0206910 A1 * | 9/2005 | Schroeder et al. | 356/614 |
| 2006/0186211 A1 * | 8/2006 | Kim et al. | 235/492 |
| 2006/0206910 A1 | 9/2006 | Kozenitzky et al. | |

* cited by examiner

METHOD OF USING A FOLDABLE CARD AS A USB CONTACT

PRIOR APPLICATION

This application is a U.S. national phase application based on International Application No. PCT/US2007/078332, filed 13 Sep. 2007, claiming priority from U.S. Provisional Patent Application No. 60/826,548, filed 22 Sep. 2006.

TECHNICAL FIELD

The method relates to a method for using a foldable card as a USB contact that is connectable to a computer.

BACKGROUND OF INVENTION

The use of electronic devices connected to computers is becoming more common. External devices are sometimes connected to the computer via USB contacts. However, the currently available external devices and the accompanying USB contacts are often too large and cumbersome to conveniently store and carry in, for example, wallets. There is a need for a more convenient way of storing devices that are connectable to the USB contacts while protecting the USB contacts when the card is in an expanded flat position.

SUMMARY OF INVENTION

The method of the present invention provides a solution to the above-outlined problems. More particularly, it is a method for using a foldable card as a USB contact. A foldable flat card has a folding line, a foldable front flap section and foldable rear flap section. The card has front and rear contact segments. The front flap section is upwardly folded until the front flap section bears against a top surface of the card. The rear flap section is also upwardly folded until the rear flap section bears against the top surface of the card. A front segment is downwardly folded along the central folding line until an underside of a rear segment bears against an underside of the front segment and the rear contact segment comes into contact with the front contact segment to form a fully functioning USB contact. The USB contact is then inserted into a computer. The small size of the card makes it suitable for storage in a wallet and it can include a suitable magnetic strip like credit cards.

DETAILED DESCRIPTION

Figure 1:
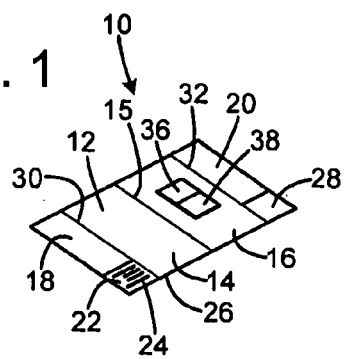
FIG. 1 is a perspective view of the card of the present invention in a flat expanded position.

With reference to FIGS. 1-5, the card 10 of the present invention has an upper surface 12 with a front half segment 14 and a rear half segment 16 so that the card 10 is foldable along a central folding line 15. As described in detail below, one important feature of the card 10 is that it is sized like a credit card and has a thickness that is thinner than a typical USB contact. However, the card can be folded into a suitable thickness that is typically used in USB contacts. The card may be made disposable.

More particularly, the front segment 14 has a bendable or foldable front flap section 18 and the rear segment 16 has a bendable or foldable rear flap section 20. The flap section 18 has a front contact segment 22 with conductors 24. Preferably, the contact segment 22 is located along a side edge 26 of the card 10. However, the contact segment may be located in any suitable part of the flap section 18. Similarly, the rear flap section 20 has a rear contact segment 28 which may also have conductors although this is not necessary. The contact 28 may have a ground if so desired. The flap sections 18, 20 protect the contact segments 22, 28 when the card is in the expanded position.

In FIG. 1, the card is in the flat expanded position so that the card 10 looks like a typical credit or bank card. Preferably, the card is 86 mm long and 54 mm wide and the thickness should be below 1.1 mm so that when the card is folded, the thickness does not exceed 2.2 mm. Of course, other dimensions may also be used, as desired.

The card 10 may be made of a plastic material that encloses a memory 36, such as a suitable digital memory, and a computer processor 38. The digital memory may be connected to the conductors of the USB contact. Any usable type of memory may be used such as flash memory including smartcard or any other suitable technology.

Figure 2:
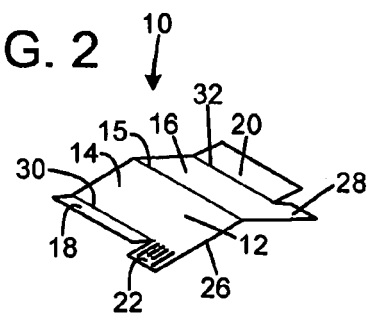
FIG. 2 is a perspective view of the card with flaps in a partially bent position.
Figure 3:
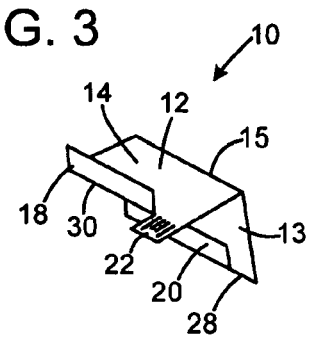
FIG. 3 is a perspective view of the card partially folded.
Figure 4:
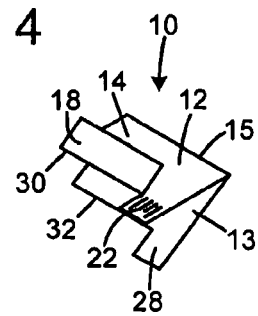
FIG. 4 is a perspective view of the card in an almost completely folded position.
Figure 5:
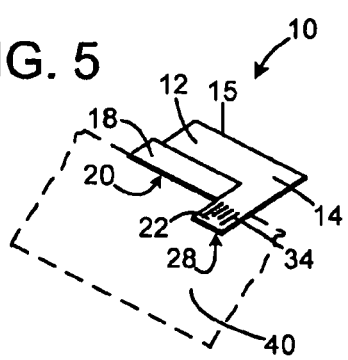
FIG. 5 is a perspective view of the card in a folded position.

As shown in FIG. 2, the card 10 may be folded by first upwardly folding the flap sections 18, 20 along the folding lines 30, 32, respectively. The front segment 14 and rear segment 16 are then folded downwardly along central folding line 15. It is important to note the front contact segment 22 and the rear contact segment 28 are not folded. The flap section 18 is fully folded to rest upon the top surface 12 while the flap section 20 is fully folded to rest upon a bottom surface 13, as best shown in FIG. 5, to expose the contact segments 22, 28 to protrude outwardly. In this way, the contact segment 28 is put into contact with the contact segment 22 so that they are aligned with one another. Both contact segment 28 and the contact segment 22 protrude beyond the folding line 30 to form a fully functional USB contact 34 that may be inserted into a computer 40 so that information may be transferred to and from the memory and/or processor of the card. The card may also include codes to instruct the computer connected to the card to obtain information on the Internet.

The card 10 may then be withdrawn from the computer 40 and unfolded into the flat expanded position again, as shown in FIG. 1, so that snap locks hold the card in the flat expanded position, as described in detail below.

Figure 6:
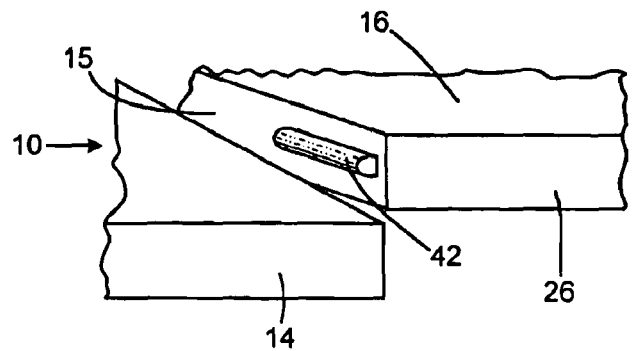
FIG. 6 is a detailed view of a snap lock arrangement of the present invention.

FIG. 6 shows a detailed view of a snap lock arrangement so that the card remains in the flat position when it is unfolded into the flat expanded position shown in FIG. 1. The protrusions of snap lock 42, disposed inside the folding lines 30, 32, protrude into cavities in front section 14, the rear section 16, the front flap section 18 and rear flap section 20 to ensure that the card remains in the flat position. It may also be possible to design the card to include phased edges so that the sides overlap one another to hold the card in the flat position.

Figure 7:
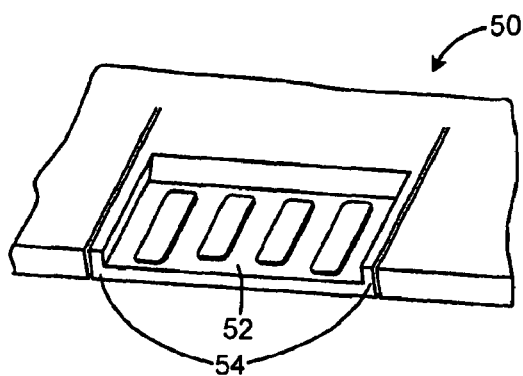
FIG. 7 is a detailed view of a guide member of an alternative embodiment of the card of the present invention.

The card could be made thicker but then the USB contact area should be made thinner so that it is about 2.2 mm which is the typical thickness of USB contacts. This means the card may be thicker than 1.1 mm when unfolded but the contact area is made at a thickness of about 1.1 mm so that the thickness of the contact area is about 2.2 mm when the card is folded. It may also be possible to use guiding members to make it easier to insert the folded USB contact into a computer. FIG. 7 shows a detailed view of an alternative embodiment of a card 50 of the present invention. The card 50 has a thinned contact segment 52 with guiding members 54 to make insertion into a computer easier.

Figure 8:
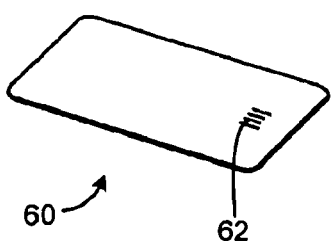
FIG. 8 is a perspective view of a flat card of a second embodiment of the present invention.
Figure 9:
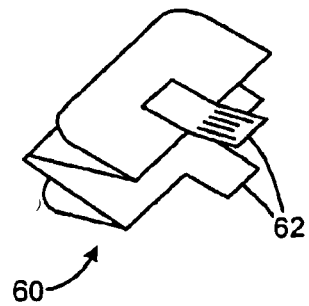
FIG. 9 is a perspective view of the card shown in FIG. 8 in a folded position.
Figure 10:
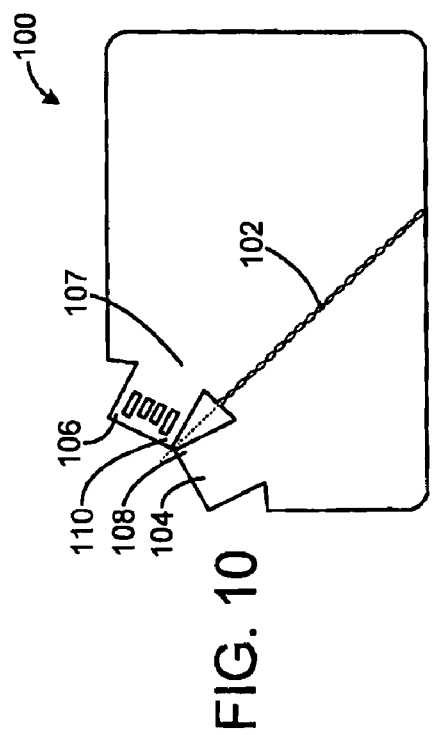
FIG. 10 is a top view of the card of a third embodiment of the card of the present invention.
Figure 13:
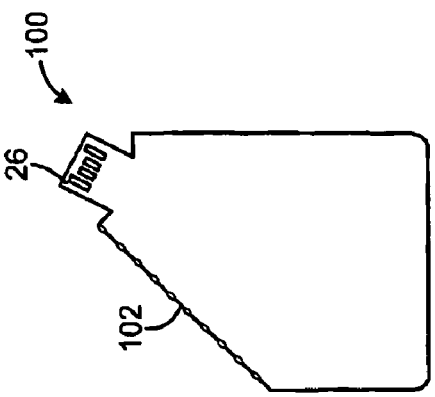
FIG. 13 is a top view of the card shown in FIG. 12 in a folded position.
Figure 12:
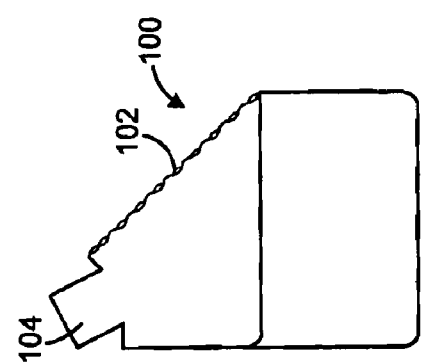
FIG. 12 is a bottom view of the card shown in FIG. 10 in a folded position.
Figure 11:
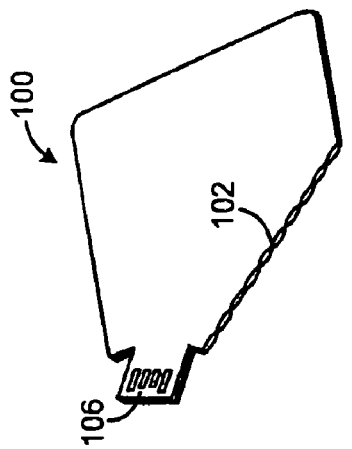
FIG. 11 is a top view of the card shown in FIG. 10 in a folded position.

FIGS. 8-9 show an alternative embodiment of a card 60 of the present invention. As best shown in FIG. 8, the contact segment 62 is disposed inside the card 60 so that it is better protected when in the expanded flat position. FIG. 9 shows the card 60 in the folded position with the contact segment 62 exposed and protruding away from the card. The contact segment is ready for insertion into a computer. The card is folded along various folding lines similar to the method described above.

FIGS. 10-13 show a third embodiment of a card 100 that is very similar to the embodiments of the cards described above. One distinguishing feature is that the card 100 has a folding line 102 that is at an angle α and the contact segments 104, 106 are also protruding at an angle relative to the longitudinal direction of the card 100 and are disposed at a corner 107 of the card 100. A corner 108 of the contact segment 104 is immediately adjacent to or even in contact with a corner 110 of the contact segment 106. The contact segments 104, 106 protrude in a direction that is substantially parallel to the folding line 102. One advantage is that it is only necessary to fold the card once for the USB contact to appear. The functions and principles of the card 100 are otherwise virtually identical to the card described above.

While the present invention has been described in accordance with preferred compositions and embodiments, it is to be understood that certain substitutions and alterations may be made thereto without departing from the spirit and scope of the following claims.

The invention claimed is:
1. A method of using a USB contact, comprising:
providing a foldable flat card having a folding line and a foldable front flap section and foldable rear flap section, the card having contact segments;
upwardly folding the front flap section until the front flap section bears against a top surface of a front half segment of the card so that the contact segment protrudes outwardly from the front half segment;
upwardly folding the rear flap section until the rear flap section bears against the top surface of a rear half segment of the card so that the contact segment protrudes outwardly from the rear half segment;
downwardly folding the front half segment along the folding line until an underside of the rear half segment bears against an underside of the front half segment and the contact segment comes into contact with the contact segment to form a USE contact; and
inserting the USE contact into a computer.

2. The method according to claim 1 wherein the method, further comprises withdrawing the USB contact from the computer and folding the front flap sections into an expanded flat position to protect the contact segments.

3. The method according to claim 1 wherein the method further comprises unfolding the front half segment and the rear half segment along the folding line to put the card into a flat expanded position.

4. The method according to claim 1 wherein the method further comprises snapping a lock into a locked position to hold the card in the flat expanded position.

5. The method according to claim 1 wherein the method, further comprises snapping locks of the flap sections to hold the flap sections in a flat expanded position.

6. The method according to claim 1 wherein the method further comprises providing the card with an embedded memory.

7. The method according to claim 6 wherein the method further comprises providing the card with a computer processor.

8. The method according to claim 1 wherein the method further comprises folding a card along an angled folding line.

9. The method according to claim 8 wherein the method further comprises providing the card with contact segments disposed at a corner so that the contact segments protrude in a direction that is substantially parallel to the folding line.

* * * * *